US012802949B2

(12) United States Patent
Yamamoto et al.

(10) Patent No.: US 12,802,949 B2
(45) Date of Patent: Nov. 17, 2026

(54) SUBSTRATE PROCESSING APPARATUS

(71) Applicant: Tokyo Electron Limited, Tokyo (JP)

(72) Inventors: Takari Yamamoto, Miyagi (JP); Kazuhito Yamada, Miyagi (JP); Masanori Takahashi, Miyagi (JP); Shinya Ishikawa, Miyagi (JP); Shota Ezaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 19 days.

(21) Appl. No.: 18/957,942

(22) Filed: Nov. 25, 2024

(65) Prior Publication Data

US 2025/0087470 A1 Mar. 13, 2025

Related U.S. Application Data

(63) Continuation of application No. PCT/JP2023/018559, filed on May 18, 2023.

(60) Provisional application No. 63/346,205, filed on May 26, 2022.

(51) Int. Cl.
*H01J 37/32* (2006.01)

(52) U.S. Cl.
CPC .. *H01J 37/32724* (2013.01); *H01J 37/32697* (2013.01)

(58) Field of Classification Search
CPC .... H10P 72/722; H10P 72/70; H10P 72/0602; H01J 37/32568; H01J 37/32724; H01J 37/32697
See application file for complete search history.

(56) References Cited

U.S. PATENT DOCUMENTS

| | | | | |
|---|---|---|---|---|
| 2017/0025255 A1* | 1/2017 | Tandou | ............ | H01J 37/32532 |
| 2017/0215230 A1* | 7/2017 | Parkhe | ................ | H05B 1/0233 |

(Continued)

FOREIGN PATENT DOCUMENTS

| | | |
|---|---|---|
| JP | 2017-028111 A | 2/2017 |
| JP | 2019-505092 A | 2/2019 |
| JP | 2020-077652 A | 5/2020 |

(Continued)

OTHER PUBLICATIONS

International Search Report and Written Opinion mailed on Jul. 25, 2023, received for PCT Application No. PCT/JP2023/018559, filed on May 18, 2023, 12 pages including English Translation.

*Primary Examiner* — Patrick C Chen
(74) *Attorney, Agent, or Firm* — XSENSUS LLP

(57) ABSTRACT

A substrate processing apparatus includes: a chamber having a processing space; a base arranged inside the processing space and having an internal space; an electrostatic chuck arranged on the base and including a dielectric member having a support surface, at least one heater electrode layer arranged inside the dielectric member and formed of a first material, and at least one resistive layer arranged inside the dielectric member and formed of a second material, wherein a resistance temperature coefficient of the second material is equal to or greater than that of the first material; a control circuit arranged inside the internal space and configured to control power to be applied to the at least one heater electrode layer; and a detection circuit arranged inside the internal space and configured to detect a voltage applied to the at least one resistive layer.

15 Claims, 11 Drawing Sheets

(56) References Cited

U.S. PATENT DOCUMENTS

| | | | | |
|---|---|---|---|---|
| 2021/0090930 | A1* | 3/2021 | Miwa | H10P 72/0602 |
| 2021/0265143 | A1* | 8/2021 | Endo | H01J 37/32724 |

FOREIGN PATENT DOCUMENTS

| | | | |
|---|---|---|---|
| JP | 2021-132190 | A | 9/2021 |
| JP | 2021-163902 | A | 10/2021 |
| WO | 2018/190257 | A1 | 10/2018 |

* cited by examiner

SUBSTRATE PROCESSING APPARATUS

CROSS-REFERENCE TO RELATED APPLICATIONS

This application is a bypass continuation application of international application No. PCT/JP2023/018559 having an international filing date of May 18, 2023 and designating the United States, the international application being based upon and claiming the benefit of priority from U.S. Patent Application No. 63/346,205, filed on May 26, 2022, the entire contents of each are incorporated herein by references.

TECHNICAL FIELD

An exemplary embodiment of the present disclosure relates to a substrate processing apparatus.

BACKGROUND

A substrate processing apparatus is used in processing a substrate. The substrate processing apparatus includes a chamber, a base arranged inside the chamber, and an electrostatic chuck arranged on the base. In the following Patent Document 1, a heater is arranged inside the electrostatic chuck.

PRIOR ART DOCUMENT

Patent Document

Patent Document 1: Japanese Laid-Open Patent Publication No. 2021-163902

SUMMARY

According to one embodiment of the present disclosure, a substrate processing apparatus includes: a chamber having a processing space provided therein; a base arranged inside the processing space and having an internal space provided therein; an electrostatic chuck arranged on the base and including a dielectric member having a support surface with a substrate support surface, at least one heater electrode layer arranged inside the dielectric member and formed of a first material, and at least one resistive layer arranged inside the dielectric member and formed of a second material, the at least one resistive layer having a thickness of 300 μm or less, wherein a resistance temperature coefficient of the second material is equal to or greater than a resistance temperature coefficient of the first material; a control circuit arranged inside the internal space and configured to control power to be applied to the at least one heater electrode layer; and a detection circuit arranged inside the internal space and configured to detect a voltage applied to the at least one resistive layer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
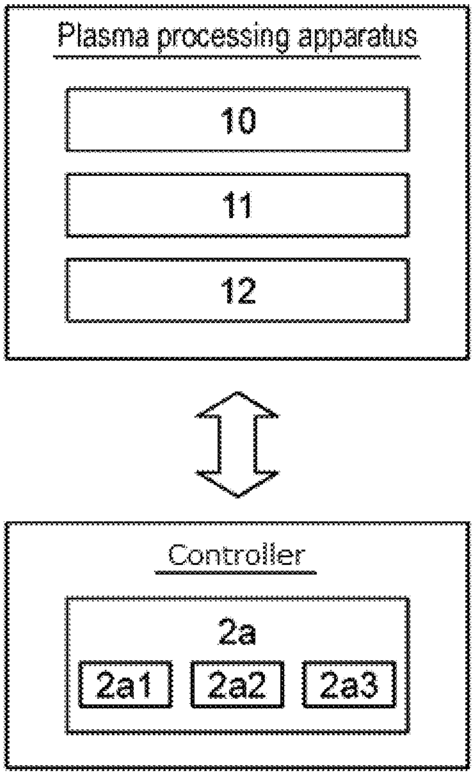
FIG. 1 is a view for explaining an example of a configuration of a plasma processing system.

Various exemplary embodiments will be described in detail below with reference to the drawings. Throughout the drawings, the same or similar parts are denoted by the same reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A plasma processing apparatus, which is a substrate processing apparatus according to one exemplary embodiment, will be described with reference to FIGS. 1 and 2.

Figure 2:
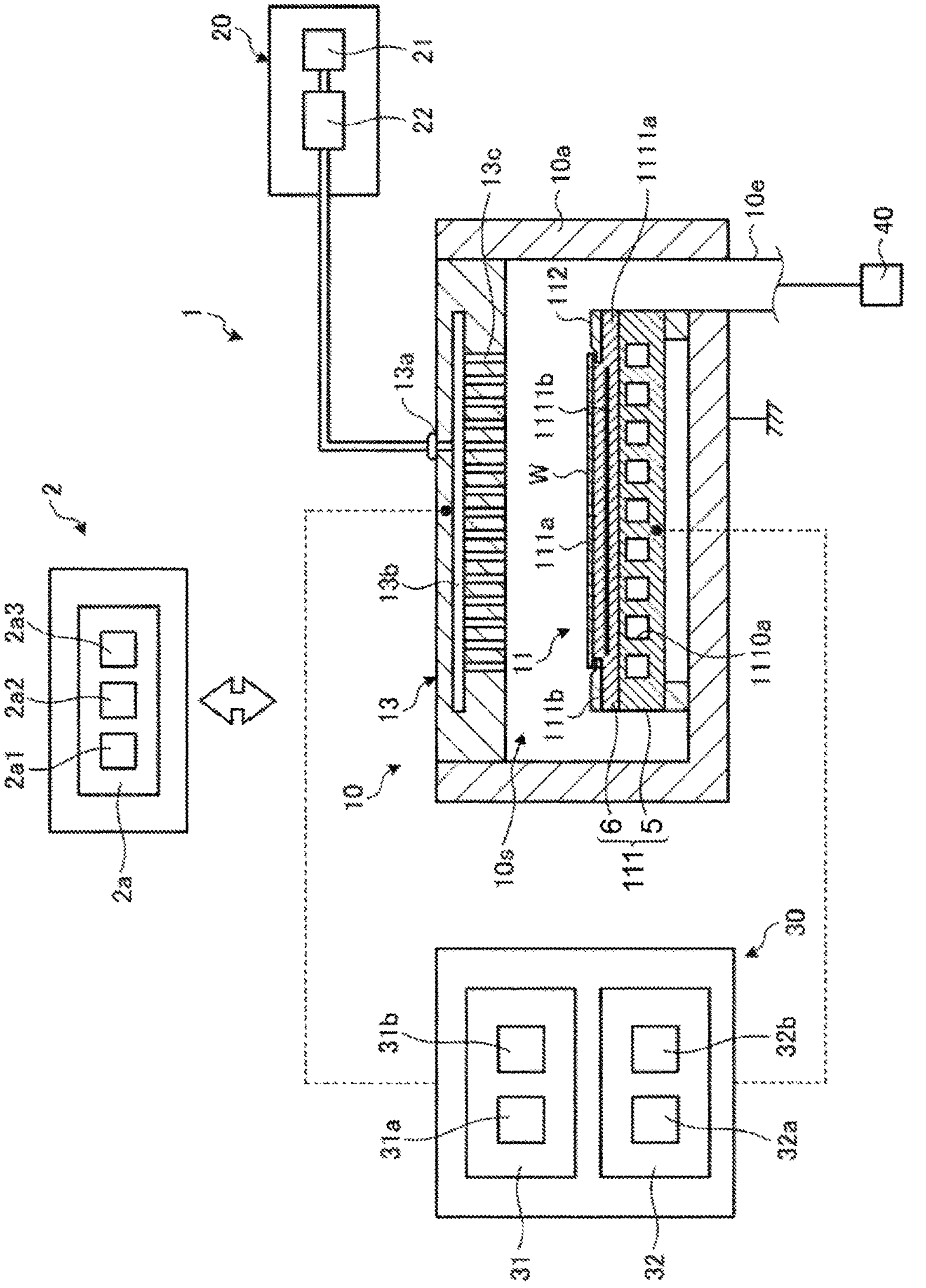
FIG. 2 is a view for explaining an example of a configuration of a capacitively-coupled plasma processing apparatus.

FIG. 1 is a view for explaining an example of a configuration of a plasma processing system. In one embodiment, the plasma processing system includes a plasma processing apparatus 1 and a controller 2. The plasma processing system is an example of a substrate processing system, and the plasma processing apparatus 1 is an example of the substrate processing apparatus. The plasma processing apparatus 1 includes a plasma processing chamber 10, a substrate support 11, and a plasma generator 12. The plasma processing chamber 10 has a plasma processing space. In addition, the plasma processing chamber 10 includes at least one gas supply port for supplying at least one processing gas to the plasma processing space therethrough, and at least one gas exhaust port for exhausting a gas from the plasma processing space therethrough. The gas supply port is connected to a gas supplier 20, which will be described later, and the gas exhaust port is connected to an exhaust system 40 which will be described later. The substrate support 11 is arranged inside the plasma processing space and has a substrate support surface for supporting a substrate.

The plasma generator 12 is configured to generate plasma from at least one processing gas supplied into the plasma processing space. The plasma formed in the plasma processing space may be capacitively-coupled plasma (CCP), inductively-coupled plasma (ICP), ECR plasma (Electron-Cyclotron-Resonance Plasma), helicon wave plasma (HWP), surface wave plasma (SWP), or the like. In addition, various types of plasma generators may be used, including an AC (Alternating Current) plasma generator and a DC (Direct Current) plasma generator. In one embodiment, an AC signal (AC power) used in the AC plasma generator has a frequency in a range of 100 kHz to 10 GHz. Thus, the AC signal includes an RF (Radio Frequency) signal and a microwave signal. In one embodiment, the RF signal has a frequency in a range of 100 kHz to 150 MHz.

The controller 2 processes computer-executable instructions that cause the plasma processing apparatus 1 to execute various operations described in the present disclosure. The controller 2 may be configured to control each constituent element of the plasma processing apparatus 1 to execute the various operations described herein. In one embodiment, a part or all of the controller 2 may be included in the plasma processing apparatus 1. The controller 2 may include a processor **2*a*1, a storage 2*a*2, and a communication interface 2*a*3. The controller 2 is implemented by, for example, a computer 2*a*. The processor 2*a*1 may be configured to read a program from the storage 2*a*2 and execute the read program to perform various control operations. This program may be stored in the storage 2*a*2 in advance, or may be acquired via a medium when necessary. The acquired program is stored in the storage 2*a*2 and is read and executed from the storage 2*a*2 by the processor 2*a*1. The medium may be various storage media readable by the computer 2*a*, or may be a communication line connected to the communication interface 2*a*3. The processor 2*a*1 may be a CPU (Central Processing Unit). The storage 2*a*2 may include a RAM (Random Access Memory), a ROM (Read Only Memory), a HDD (Hard Disk Drive), a SSD (Solid State Drive), or a combination thereof. The communication interface 2*a*3 may communicate with the plasma processing apparatus 1** via a communication line such as a LAN (Local Area Network).

Although various exemplary embodiments have been described above, the present disclosure is not limited to the exemplary embodiments described above, and various omissions, substitutions, and changes may be made. In addition, elements in different embodiments may be combined to form other embodiments.

Hereinafter, an example of a configuration of a capacitively-coupled plasma processing apparatus as an example of the plasma processing apparatus 1 will be described. FIG. 2 is a view for explaining the example of the configuration of the capacitively-coupled plasma processing apparatus.

A capacitively-coupled plasma processing apparatus 1 includes a plasma processing chamber 10, a gas supplier 20, a power supply 30, and an exhaust system 40. The plasma processing apparatus 1 also includes a substrate support 11 and a gas introducer. The gas introducer is configured to introduce at least one processing gas into the plasma processing chamber 10. The gas introducer includes a shower head 13. The substrate support 11 is arranged inside the plasma processing chamber 10. The shower head 13 is arranged above the substrate support 11. In one embodiment, the shower head 13 constitutes at least a portion of a ceiling of the plasma processing chamber 10. The plasma processing chamber 10 has a plasma processing space **10*s* defined by the shower head 13, a sidewall 10*a* of the plasma processing chamber 10, and the substrate support 11. The plasma processing chamber 10 is grounded. The shower head 13 and the substrate support 11 are electrically insulated from a housing of the plasma processing chamber 10**.

The substrate support 11 includes a main body 111 and a ring assembly 112. The main body 111 has a central region **111*a* for supporting a substrate W and an annular region 111*b* for supporting the ring assembly 112. A wafer is an example of the substrate W. The annular region 111*b* of the main body 111 surrounds the central region 111*a* of the main body 111 in a plan view. The substrate W is arranged on the central region 111*a* of the main body 111, and the ring assembly 112 is arranged on the annular region 111*b* of the main body 111 so as to surround the substrate W on the central region 111*a* of the main body 111. Thus, the central region 111*a* is also referred to as a substrate support surface for supporting the substrate W, and the annular region 111*b* is also referred to as a ring support surface for supporting the ring assembly 112**.

In one embodiment, the main body 111 includes a base 5 and an electrostatic chuck 6. The base 5 includes a conductive member. The conductive member of the base 5 may function as a lower electrode. The electrostatic chuck 6 is arranged on the base 5. The electrostatic chuck 6 includes a ceramic member **1111*a* and an electrostatic electrode 1111*b* arranged inside the ceramic member 1111*a*. The ceramic member 1111*a* has the central region 111*a*. In one embodiment, the ceramic member 1111*a* also has the annular region 111*b*. Other members surrounding the electrostatic chuck 6, such as an annular electrostatic chuck or an annular insulating member, may have the annular region 111*b*. In this case, the ring assembly 112 may be arranged on the annular electrostatic chuck or the annular insulating member, or may be arranged on both the electrostatic chuck 6 and the annular insulating member. In addition, at least one RF/DC electrode coupled to an RF power supply 31 and/or a DC power supply 32, which will be described later, may be arranged inside the ceramic member 1111*a*. In this case, the at least one RF/DC electrode functions as a lower electrode. When a bias RF signal and/or a DC signal, which will be described later, is supplied to the at least one RF/DC electrode, the RF/DC electrode is also referred to as a bias electrode. The conductive member of the base 5 and the at least one RF/DC electrode may function as a plurality of lower electrodes. In addition, the electrostatic electrode 1111*b* may function as a lower electrode. Thus, the substrate support 11** includes at least one lower electrode.

The ring assembly 112 includes one or more annular members. In one embodiment, the one or more annular members include one or more edge rings and at least one cover ring. The edge ring is formed of a conductive material or an insulating material, and the cover ring is formed of an insulating material.

In addition, the substrate support 11 may also include a temperature adjustment module configured to adjust at least one of the electrostatic chuck 6, the ring assembly 112, and the substrate to have a target temperature. The temperature adjustment module may include a heater, a heat transfer medium, a flow path **1110*a*, or a combination thereof. A heat transfer fluid such as brine or a gas flows through the flow path 1110*a*. In one embodiment, the flow path 1110*a* is formed in the base 5, and one or more heaters are arranged inside the ceramic member 1111*a* of the electrostatic chuck 6. In addition, the substrate support 11 may also include a heat-transfer-gas supplier configured to supply a heat transfer gas to a gap between a back surface of the substrate W and the central region 111***a*.

The shower head 13 is configured to introduce at least one processing gas from the gas supplier 20 into the plasma processing space 10*s*. The shower head 13 includes at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. In addition, the shower head 13 includes at least one upper electrode. The gas introducer may include, in addition to the shower head 13, one or more side gas injectors (SGIs) attached to one or more openings formed in the sidewall 10*a*.

The gas supplier 20 may include at least one gas source 21 and at least one flow rate controller 22. In one embodiment, the gas supplier 20 is configured to supply at least one processing gas from a corresponding gas source 21 to the shower head 13 via a corresponding flow rate controller 22. Each flow rate controller 22 may include a mass flow controller or a pressure-controlled flow rate controller. Further, the gas supplier 20 may include at least one flow rate modulation device configured to modulate or pulse a flow rate of the at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. As a result, plasma is generated from at least one processing gas supplied to the plasma processing space 10*s*. Thus, the RF power supply 31 may function as at least a portion of the plasma generator 12. In addition, by supplying a bias RF signal to at least one lower electrode, a bias potential is generated on the substrate W, and ion components in the formed plasma may be attracted to the substrate W.

In one embodiment, the RF power supply 31 includes a first RF generator 31*a* and a second RF generator 31*b*. The first RF generator 31*a* is coupled to at least one lower electrode and/or at least one upper electrode via at least one impedance matching circuit, and is configured to generate a source RF signal (source RF power) for plasma generation. In one embodiment, the source RF signal has a frequency in a range of 10 MHz to 150 MHz. In one embodiment, the first RF generator 31*a* may be configured to generate a plurality of source RF signals having different frequencies. The generated one or more source RF signals are supplied to at least one lower electrode and/or at least one upper electrode.

The second RF generator 31*b* is coupled to at least one lower electrode via at least one impedance matching circuit, and is configured to generate a bias RF signal (bias RF power). A frequency of the bias RF signal may be the same as or different from that of the source RF signal. In one embodiment, the bias RF signal has a frequency lower than the frequency of the source RF signal. In one embodiment, the bias RF signal has a frequency in a range of 100 kHz to 60 MHz. In one embodiment, the second RF generator 31*b* may be configured to generate a plurality of bias RF signals having different frequencies. The generated one or more bias RF signals are supplied to at least one lower electrode. In addition, in various embodiments, at least one of the source RF signal and the bias RF signal may be pulsed.

In addition, the power supply 30 may include a DC power supply 32 coupled to the plasma processing chamber 10. The DC power supply 32 includes a first DC generator 32*a* and a second DC generator 32*b*. In one embodiment, the first DC generator 32*a* is connected to at least one lower electrode and is configured to generate a first DC signal. The generated first DC signal is applied to at least one lower electrode. In one embodiment, the second DC generator 32*b* is connected to at least one upper electrode and is configured to generate a second DC signal. The generated second DC signal is applied to at least one upper electrode.

In various embodiments, the first and second DC signals may be pulsed. In this case, a sequence of voltage pulses is applied to at least one lower electrode and/or at least one upper electrode. The voltage pulses may have a pulse waveform that is rectangular, trapezoidal, triangular, or a combination thereof. In one embodiment, a waveform generator for generating the sequence of voltage pulses from the DC signal is connected between the first DC generator 32*a* and at least one lower electrode. Thus, the first DC generator 32*a* and the waveform generator constitute a voltage pulse generator. When the second DC generator 32*b* and the waveform generator constitute the voltage pulse generator, the voltage pulse generator is connected to at least one upper electrode. The voltage pulses may have a positive polarity or a negative polarity. In addition, the sequence of voltage pulses may include one or more positive polarity voltage pulses and one or more negative polarity voltage pulses in one period. In addition, the first and second DC generators 32*a* and 32*b* may be provided in addition to the RF power supply 31, or the first DC generator 32*a* may be provided instead of the second RF generator 31*b*.

The exhaust system 40 may be connected to, for example, a gas exhaust port 10*e* provided at the bottom of the plasma processing chamber 10. The exhaust system 40 may include a pressure regulating valve and a vacuum pump. An internal pressure of the plasma processing space 10*s* is adjusted by the pressure regulating valve. The vacuum pump may include a turbo molecular pump, a dry pump, or a combination thereof.

Figure 3:
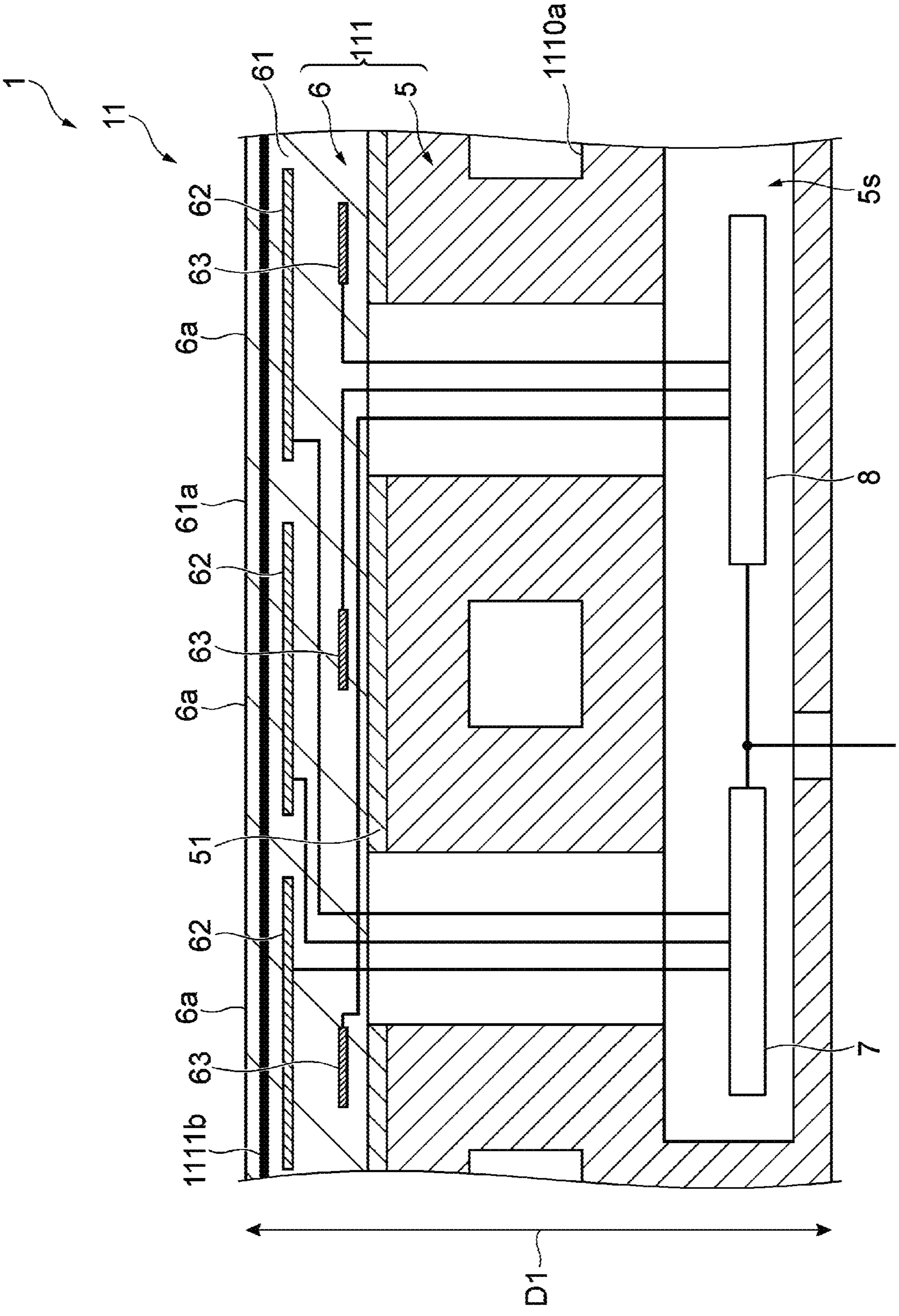
FIG. 3 is a partially-enlarged cross-sectional view of a substrate support according to an exemplary embodiment.

Hereinafter, a plasma processing apparatus according to an embodiment will be described with reference to FIGS. 3 to 6. FIG. 3 is a partially-enlarged cross-sectional view of the substrate support according to an exemplary embodiment. As described above, the plasma processing apparatus 1 includes the chamber 10, the base 5, and the electrostatic chuck 6. The plasma processing chamber 10 has a plasma processing space 10*s* provided therein. The base 5 is arranged inside the plasma processing space 10*s*. The base 5 has an internal space 5*s* provided therein.

The electrostatic chuck 6 is arranged on the base 5. In one example, the electrostatic chuck 6 may be arranged on the base 5 via a heat insulating member (adhesive layer) 51. The heat insulating member 51 is formed of, for example, silicone. The electrostatic chuck 6 includes a dielectric member 61, at least one heater electrode layer, and at least one resistive layer. The at least one resistive layer has a thickness of 300 μm or less. In one embodiment, the at least one resistive layer may have a thickness of 100 μm or less.

Hereinafter, the plasma processing apparatus 1 including a plurality of heater electrode layers 62 and a plurality of resistive layers 63 will be described. Further, the plasma processing apparatus 1 may include a single heater electrode layer and a single resistive layer. Each of the plurality of resistive layers 63 has a thickness of 300 μm or less. Each of the plurality of resistive layers 63 may have a thickness of 100 μm or less.

The ceramic member 1111*a* is an example of the dielectric member 61. The ceramic member 1111*a* may be formed by thermal spray. The dielectric member 61 may be formed of polyimide. The dielectric member 61 has a support surface 61*a*. The support surface 61*a* is the upper surface of each of the dielectric member 61 and the electrostatic chuck 6. The support surface 61*a* includes a substrate support surface, that is, the central region 111*a*. The support surface 61*a* may further include a ring support surface, that is, the annular region 111*b*.

As shown in FIG. 3, the plurality of heater electrode layers 62 are arranged inside the dielectric member 61. The plurality of resistive layers 63 are arranged inside the dielectric member 61. In one embodiment, positions of the plurality of heater electrode layers 62 in a thickness direction D1 in the electrostatic chuck 6 are different from positions of the resistive layers 63 in the thickness direction D1. In one example, the positions of the plurality of heater electrode layers 62 in the thickness direction D1 in the electrostatic chuck 6 are 6/7 of the thickness of the electrostatic chuck 6 from the support surface 61*a*, or are closer to the support surface 61*a* than 6/7 of the thickness of the electrostatic chuck 6 from the support surface 61*a*. In one embodiment, the plurality of heater electrode layers 62 may extend between the plurality of resistive layers 63 and the support surface 61*a*. In one example, the electrostatic electrode 1111*b* may extend between the plurality of heater electrode layers 62 and the support surface 61*a*.

Figure 4:
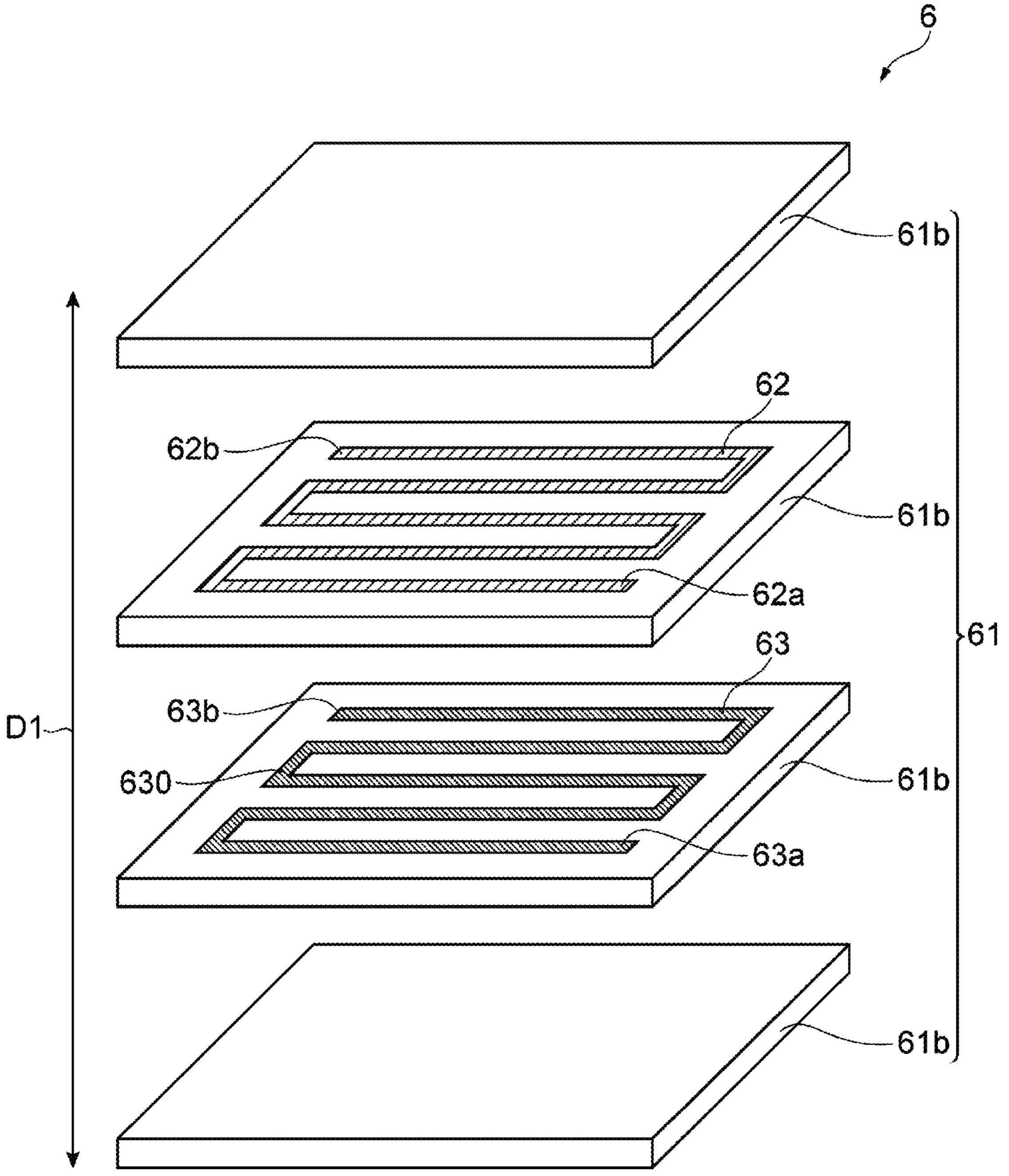
FIG. 4 is an exploded perspective view showing a configuration of an electrostatic chuck according to an exemplary embodiment.

FIG. 4 is an exploded perspective view showing a configuration of an electrostatic chuck according to an exemplary embodiment. In one example, the dielectric member 61 includes a plurality of dielectric layers 61*b* which are stacked one above another. A thickness direction D1 may be the same as a stack direction of the plurality of dielectric layers 61*b*. A thickness of one dielectric layer 61*b* is, for example, 0.35 mm. In one example, the plurality of heater electrode layers 62 and the plurality of resistive layers 63 are arranged on two of the plurality of dielectric layers 61*b*, respectively. The two dielectric layers may be adjacent to each other in the stack direction. In this case, a distance between the plurality of heater electrode layers 62 and the plurality of resistive layers 63 in the thickness direction D1 is 0.35 mm or more.

As shown in FIG. 4, each of the plurality of heater electrode layers 62 may include a first end 62*a* and a second end 62*b*. In one example, each of the plurality of heater electrode layers 62 extends in a zigzag pattern from the first end 62*a* to the second end 62*b* on a corresponding dielectric layer of the plurality of dielectric layers 61*b*. Each of the plurality of resistive layers 63 may include a first end 63*a* and a second end 63*b*. In one example, each of the plurality of resistive layers 63 extends in a zigzag pattern from the first end 63*a* to the second end 63*b* on a corresponding dielectric layer of the plurality of dielectric layers 61*b*.

The plurality of heater electrode layers 62 are formed of a first material. In one example, the first material includes at least one material selected from a first group of materials consisting of tungsten, copper, silver, and aluminum. The plurality of resistive layers 63 are formed of a second material. In one example, the second material includes at least one material selected from a second group of materials consisting of tungsten, nickel, molybdenum, and platinum.

A resistance temperature coefficient of the second material may be equal to or greater than that of the first material. Specifically, the first material and the second material are selected from the first group of materials and the second group of materials, respectively, such that the resistance temperature coefficient of the second material is equal to or greater than the resistance temperature coefficient of the first material. In one embodiment, the second material may be tungsten. The first material and the second material may be tungsten. The first material may be copper, and the second material may be tungsten. The first material may be tungsten, and the second material may be nickel. The first material may be silver, and the second material may be molybdenum. The first material may be aluminum, and the second material may be molybdenum. In one embodiment, the resistance temperature coefficient of the second material may be greater than the resistance temperature coefficient of the first material.

As shown in FIG. 3, the plasma processing apparatus 1 further includes a control circuit 7 and a detection circuit 8. In one example, the control circuit 7 and the detection circuit 8 are communicably connected to each other. The control circuit 7 and the detection circuit 8 may be communicably connected to the controller 2. The control circuit 7 and the detection circuit 8 may be portions of the controller 2. The control circuit 7 is arranged inside the internal space 5*s*. The control circuit 7 is configured to control power to be applied to each of the plurality of heater electrode layers 62. The control circuit 7 may be electrically connected to each of the first end 62*a* and the second end 62*b*.

The detection circuit 8 is arranged inside the internal space 5*s*. The detection circuit 8 is configured to detect a voltage applied to each of the plurality of resistive layers 63. The detection circuit 8 may be electrically connected to the first end 63*a* and the second end 63*b*.

Figure 5:
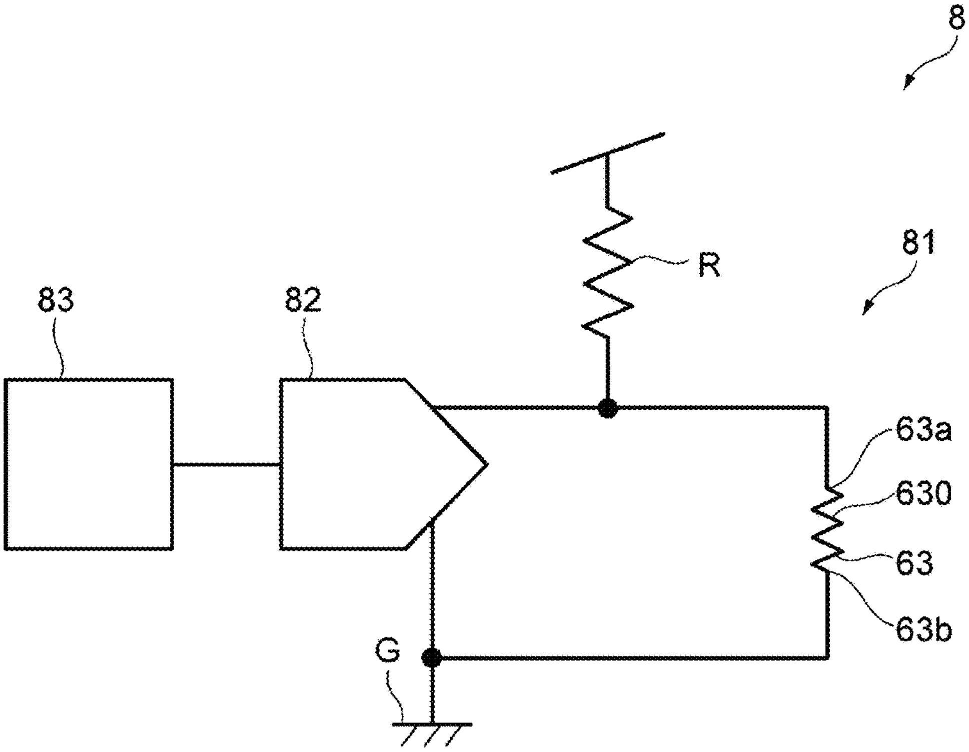
FIG. 5 is a view showing a configuration of a detection circuit according to an exemplary embodiment.

FIG. 5 is a view showing a configuration of the detection circuit according to an exemplary embodiment. In one embodiment, the detection circuit 8 may include a plurality of resistive voltage-dividing circuits 81 and a plurality of A/D converters 82. As shown in FIG. 5, each of the plurality of resistive voltage-dividing circuits 81 includes a corresponding resistive layer 630 of the plurality of resistive layers 63 and a reference resistor R. The reference resistor R is connected in series to the resistive layer 630. One end of the reference resistor R is connected to a power supply, and the other end of the reference resistor R is connected to one end (for example, the first end 63*a*) of the resistive layer 630. The other end (for example, the second end 63*b*) of the resistive layer 630 is connected to the ground G. Each of the plurality of A/D converters 82 converts a voltage applied to the corresponding resistive layer 630 into a digital value.

In one embodiment, each of the plurality of A/D converters 82 is connected to the first end 63*a* of the resistive layer 630. The first end 63*a* is connected to the reference resistor R. The second end 63*b* may be connected to the ground G. A power supply voltage is applied to the reference resistor R and the resistive layer 630. A voltage of $R2/(R1+R2)\times Vin$ is applied to the resistive layer 630. Here, R1 is the resistance value of the reference resistor R, R2 is the resistance value of the resistive layer 630, and Vin is the power supply voltage. The A/D converter 82 converts the voltage applied to the resistive layer 630 into a digital value. In one example, the detection circuit 8 further includes an FPGA (Field Programmable Gate Array) 83. The FPGA 83 acquires the digital value from the A/D converter 82 and outputs the digital value in a communicable format.

In the plasma processing apparatus 1, a heating rate of the plurality of heater electrode layers 62 are controlled according to the power controlled by the control circuit 7. The temperature of the electrostatic chuck 6 changes according to the heating rate of the plurality of heater electrode layers 62. When the temperature of the electrostatic chuck 6 changes, a temperature of the corresponding resistive layer 630 among the plurality of resistive layers 63 arranged in the dielectric member 61 changes. When the temperature of the resistive layer 630 changes, a resistance value of the resistive layer 630 changes in proportion to the resistance temperature coefficient of the second material forming the resistive layer 630.

In the plurality of resistive voltage-dividing circuits 81, when the resistance value of the resistive layer 630 changes according to the temperature of the electrostatic chuck 6, the voltage applied to the resistive layer 630 changes. As a result, the temperature of the resistive layer 630 is specified from the voltage applied to the resistive layer 630. Therefore, in the plasma processing apparatus 1, the temperature of the electrostatic chuck is specified.

In one example, the detection circuit 8 is configured to specify the temperature of the resistive layer 630 based on the voltage applied to the resistive layer 630. A relationship between the temperature of the plurality of resistive layers 63 and the voltage applied to the plurality of resistive layers 63 may be given in advance. In one example, the detection circuit 8 stores the resistance value of the reference resistor R and a reference voltage. In another example, the control circuit 7 may be configured to specify the temperature of the resistive layer 630 based on the voltage applied to the resistive layer 630. The control circuit 7 may acquire the voltage applied to the resistive layer 630 from the detection circuit 8. In yet another example, the controller 2 may be configured to specify the temperature of the resistive layer 630 based on the voltage applied to the resistive layer 630.

Figure 6:
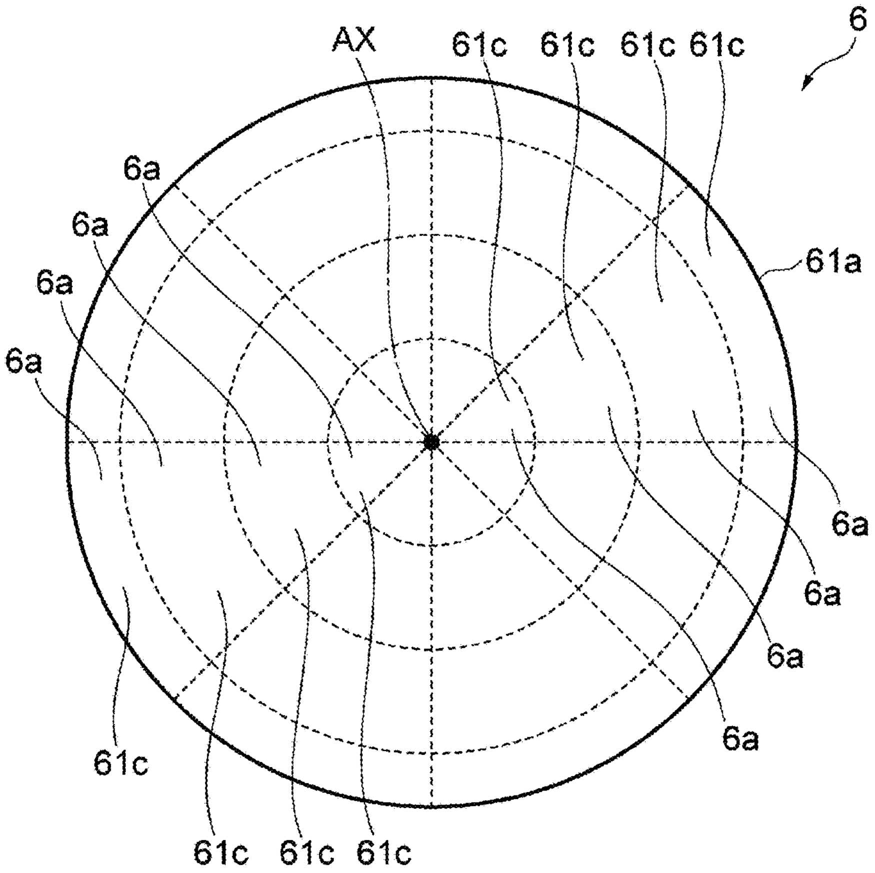
FIG. 6 is a plan view showing a configuration of a plurality of zones in the electrostatic chuck according to an exemplary embodiment.

FIG. 6 is a plan view showing a configuration of the plurality of zones of the electrostatic chuck according to an exemplary embodiment. FIG. 6 shows the support surface 61*a* as viewed in the thickness direction D1. In the example of FIG. 6, the support surface 61*a* has a circular shape centered on a central axis AX as viewed in the thickness direction D1. In one embodiment, the support surface 61*a* includes a plurality of regions 61*c*. In one example, the region concentric with the central axis AX includes one or more corresponding regions of the plurality of regions 61*c*. The plurality of regions 61*c* may include a plurality of sector-shaped regions including the central axis AX and a plurality of frustum-shaped regions centered on the central axis AX. The electrostatic chuck 6 includes a plurality of zones 6*a* each including a plurality of regions 61*c*. As shown in FIG. 6, each of the plurality of zones 6*a* may include a plurality of regions 61*c* overlapping with the plurality of zones 6*a* as viewed in the thickness direction D1. In the example shown in FIG. 6, the electrostatic chuck 6 includes 32 zones, but is not limited thereto. The electrostatic chuck 6 may include more or fewer zones than 32 zones.

Hereinafter, FIGS. 3 and 6 will be referred to. In one embodiment, the plurality of heater electrode layers 62 are arranged in the plurality of zones 6*a*, respectively. The plurality of resistive layers 63 are arranged in the plurality of zones 6*a*, respectively. The control circuit 7 is configured to control the plurality of powers applied to the plurality of heater electrode layers 62, respectively. The detection circuit 8 is configured to detect the plurality of voltages applied to the plurality of resistive layers 63, respectively.

In the plasma processing apparatus 1, the heating rate of the plurality of heater electrode layers 62 is controlled according to the plurality of powers controlled by the control circuit 7. The temperature of the plurality of zones 6*a* changes according to the heating rate of the plurality of heater electrode layers 62, respectively. When the temperature of the plurality of zones 6*a* changes, the temperature of the resistive layer 630 arranged inside the dielectric member 61 of the corresponding zone among the plurality of zones 6*a* changes. When the temperature of the resistive layer 630 changes, the resistance value of the resistive layer 630 changes in proportion to the resistance temperature coefficient of the second material forming the resistive layer 630.

When the resistance value of the resistive layer 630 changes, the voltage applied to the resistive layer 630 changes. As a result, the temperature of the resistive layer 630 is specified from the voltage applied to the resistive layer 630. Therefore, in the plasma processing apparatus 1, the temperature of the plurality of zones 6*a* is specified.

Figure 7:
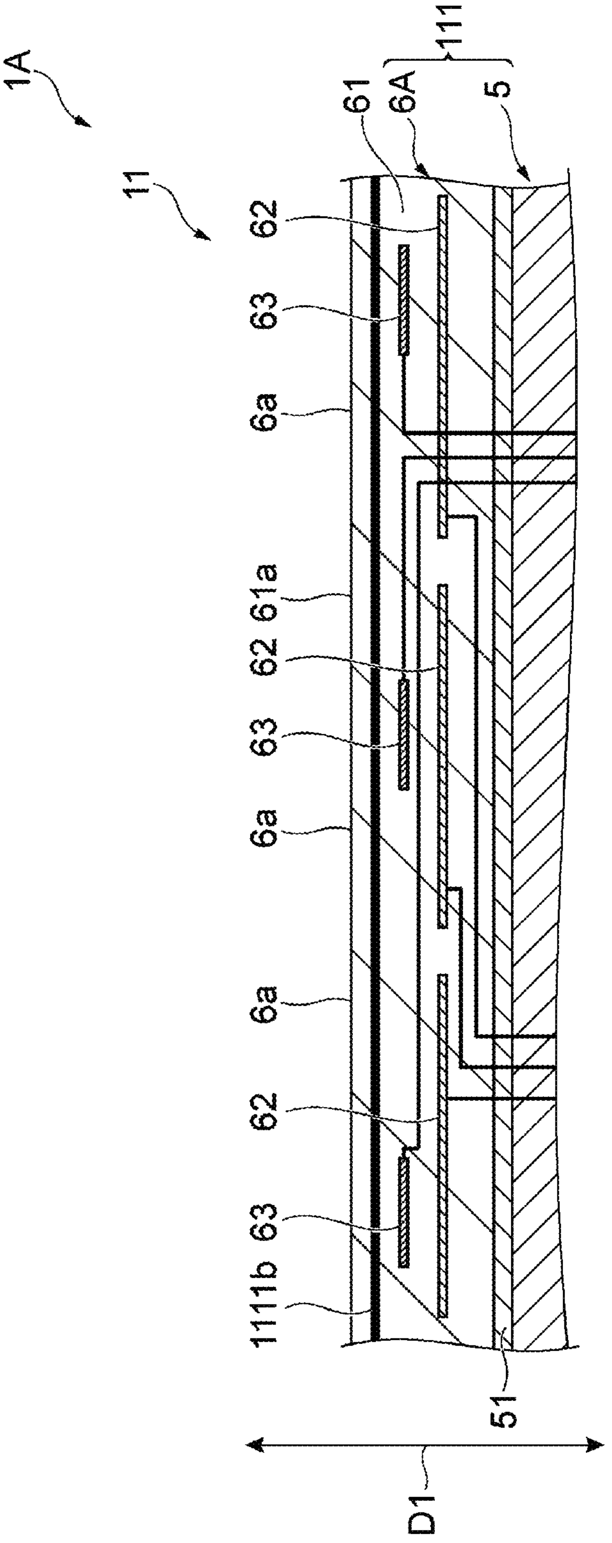
FIG. 7 is a partially-enlarged cross-sectional view of an electrostatic chuck according to another exemplary embodiment.

Next, a configuration of an electrostatic chuck of a plasma processing apparatus according to another embodiment will be described with reference to FIG. 7. FIG. 7 is a partially-enlarged cross-sectional view of the electrostatic chuck according to another exemplary embodiment. Hereinafter, an electrostatic chuck 6A of a plasma processing apparatus 1A shown in FIG. 7 will be described with a focus on differences from the electrostatic chuck 6 of the plasma processing apparatus 1.

In the plasma processing apparatus 1A, the plurality of layers 63 extend between the plurality of heater electrode layers 62 and the support surface 61*a*. According to the plasma processing apparatus 1A, since the plurality of resistive layers 63 are provided to be closer to the support surface 61*a* than the plurality of heater electrode layers 62, a difference between the temperature of the plurality of resistive layers 63 and the temperature of the support surface 61*a* is small. The electrostatic electrode 1111*b* may extend between the plurality of resistive layers 63 and the support surface 61*a*.

Figure 8:
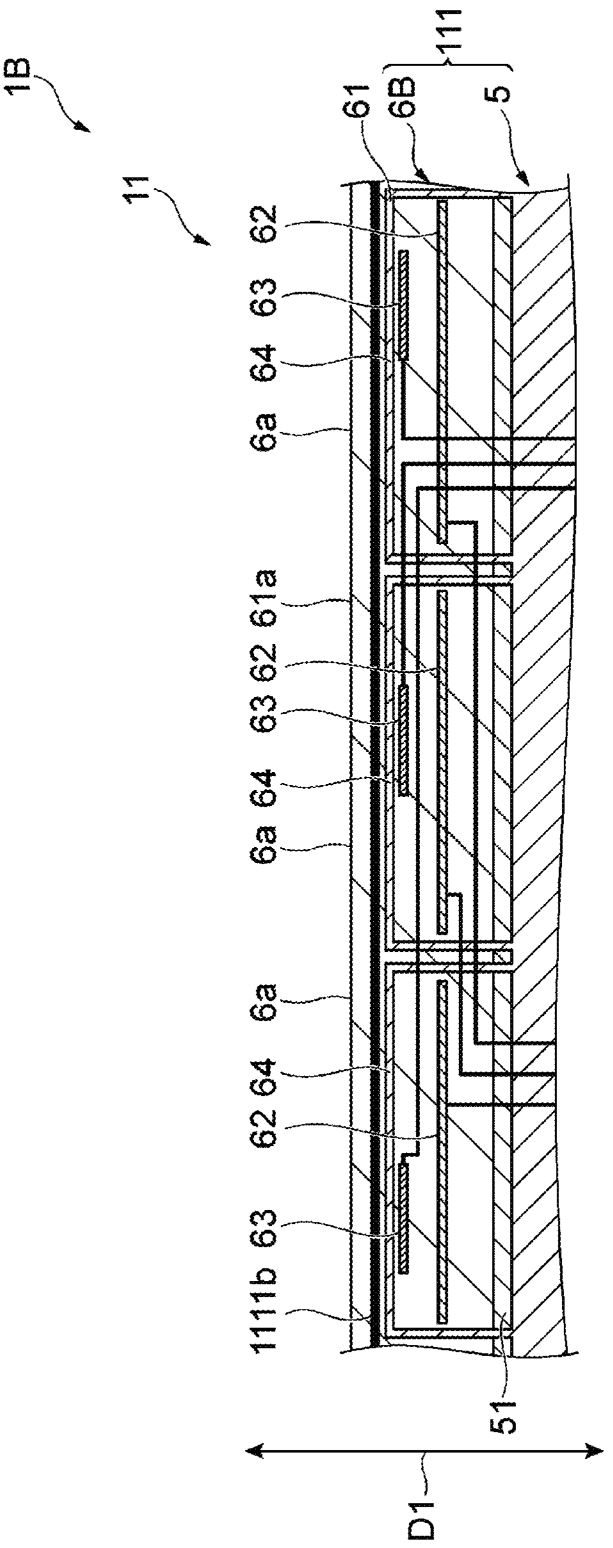
FIG. 8 is a partially-enlarged cross-sectional view of an electrostatic chuck according to yet another exemplary embodiment.

Next, a configuration of an electrostatic chuck of a plasma processing apparatus according to yet another embodiment will be described with reference to FIG. 8. FIG. 8 is a partially-enlarged cross-sectional view of the electrostatic chuck according to yet another exemplary embodiment. An electrostatic chuck 6B of a plasma processing apparatus 1B shown in FIG. 8 will be described below with a focus on differences from the electrostatic chuck 6A of the plasma processing apparatus 1A.

The electrostatic chuck 6B includes at least one radio-frequency electrode layer. In the example shown in FIG. 8, the electrostatic chuck 6B includes a plurality of radio-frequency electrode layers 64. The plurality of radio-frequency electrode layers 64 may be arranged in the plurality of zones 6*a*, respectively. Each of the plurality of radio-frequency electrode layers 64 is electrically connected to the base 5. The plurality of radio-frequency electrode layers 64 may be formed of the same material as that of the material forming the base 5. In one example, the plurality of radio-frequency electrode layers 64 are formed of aluminum. In one embodiment, the plasma processing apparatus 1B further includes a radio-frequency power supply. The radio-frequency power supply is electrically connected to the base 5. The RF power supply 31 is an example of the radio-frequency power supply.

The plurality of radio-frequency electrode layers 64 surround the plurality of heater electrode layers 62 and the plurality of resistive layers 63 in the electrostatic chuck 6B, respectively. As viewed in the thickness direction D1, the plurality of heater electrode layers 62 and the plurality of resistive layers 63 may be covered by the plurality of radio-frequency electrode layers 64, respectively. In one embodiment, the electrostatic electrode 1111*b* may extend between the support surface 61*a* and the plurality of radio-frequency electrode layers 64.

In the plasma processing apparatus 1B, the plurality of radio-frequency electrode layers 64 have the same potential as that of the base 5, so that the plurality of radio-frequency electrode layers 64 may function as a lower electrode. The plurality of heater electrode layers 62 and the plurality of resistive layers 63 are surrounded by the plurality of radio-frequency electrode layers 64 having the same potential as that of the base 5. Therefore, RF noise caused by the RF signal (RF power) may be suppressed from being applied to the plurality of resistive layers 63.

The electrostatic chuck 6B may include a single radio-frequency electrode layer. The single radio-frequency electrode layer is arranged across the plurality of zones 6*a*. The single radio-frequency electrode layer surrounds the plurality of heater electrode layers 62 and the plurality of resistive layers 63 in the electrostatic chuck 6B. As viewed in the thickness direction D1, the plurality of heater electrode layers 62 and the plurality of resistive layers 63 may be covered by the single radio-frequency electrode layer.

Figure 9:
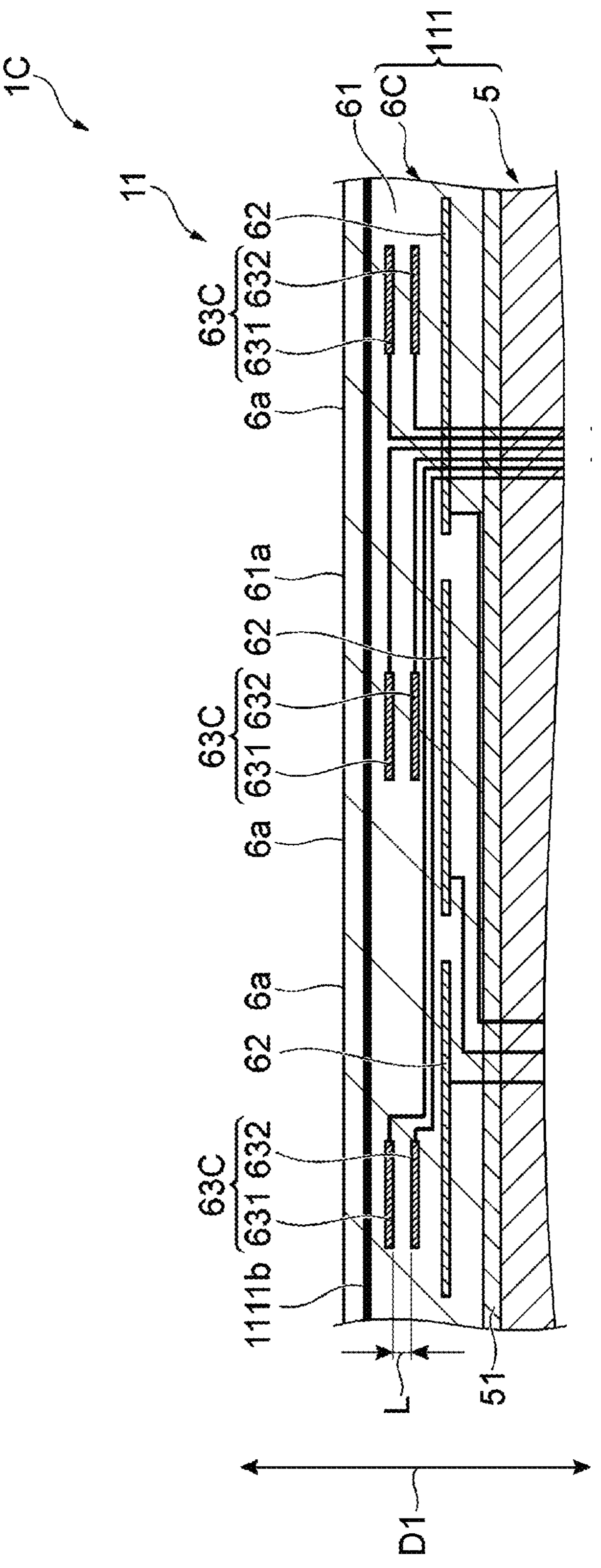
FIG. 9 is a partially-enlarged cross-sectional view of an electrostatic chuck according to yet another exemplary embodiment.

Next, a configuration of an electrostatic chuck of a plasma processing apparatus according to yet another embodiment will be described with reference to FIG. 9. FIG. 9 is a partially-enlarged cross-sectional view of the electrostatic chuck according to yet another exemplary embodiment. Hereinafter, the electrostatic chuck 6C of the plasma processing apparatus 1C shown in FIG. 9 will be described with a focus on differences from the electrostatic chuck 6A of the plasma processing apparatus 1A.

The electrostatic chuck 6C includes a plurality of resistive layers 63C. Each of the plurality of resistive layers 63C includes a first resistive layer 631 and a second resistive layer 632. The second resistive layer 632 extends between the first resistive layer 631 and the support surface 61*a*. The electrostatic electrode 1111*b* may extend between the second resistive layer 632 and the support surface 61*a*. The controller 2 is configured to detect a first voltage applied to the first resistive layer 631 and a second voltage applied to the second resistive layer 632. The detection circuit 8 may be configured to detect the first voltage applied to the first resistive layer 631 and the second voltage applied to the second resistive layer 632.

In one example, in the plasma processing apparatus 1C, the detection circuit 8 includes a plurality of resistive voltage-dividing circuits 81 and a plurality of A/D converters 82 corresponding to the first resistive layer 631 and the second resistive layer 632, respectively.

A first resistive voltage-dividing circuit corresponding to the first resistive layer 631 among the plurality of resistive voltage-dividing circuits 81 includes the first resistive layer 631 and a first reference resistor instead of the resistive layer 630 and the reference resistor R. A second resistive voltage-dividing circuit corresponding to the second resistive layer 632 among the plurality of resistive voltage-dividing circuits 81 includes the second resistive layer 632 and a second reference resistor instead of the resistive layer 630 and the reference resistor R. A first A/D converter corresponding to the first resistive layer 631 among the plurality of A/D converters 82 converts a voltage applied to the first resistive layer 631 into a digital value. A second A/D converter corresponding to the second resistive layer 632 among the plurality of A/D converters 82 converts a voltage applied to the second resistive layer 632 into a digital value.

The first voltage is applied to the first resistive layer 63. The second voltage is applied to the second resistive layer 632. The controller 2 is configured to specify a first temperature of the first resistive layer 631 and a second temperature of the second resistive layer 632 based on the first voltage and the second voltage, respectively. In another example, the detection circuit 8 or the control circuit 7 may be configured to specify the first temperature of the first resistive layer 631 and the second temperature of the second resistive layer 632 based on the first voltage and the second voltage, respectively.

The controller 2 is configured to specify a thermal flux q ($W/m^2$) from the support surface 61*a* based on a first temperature T1 (K), a second temperature T2 (K), a thermal conductivity S (W/(m·K)) of the dielectric member 61, and a distance L (m) between the first resistive layer 631 and the second resistive layer 632 in the thickness direction D1.

In one example, the controller 2 specifies the thermal flux q based on the following relational expression:

$$q = (T2 - T1)/(L/S)$$

The thermal conductivity S (W/(m·K)) and the distance L (m) may be given in advance. In one example, the controller 2 stores the thermal conductivity S (W/(m·K)) and the distance L (m).

Figure 10:
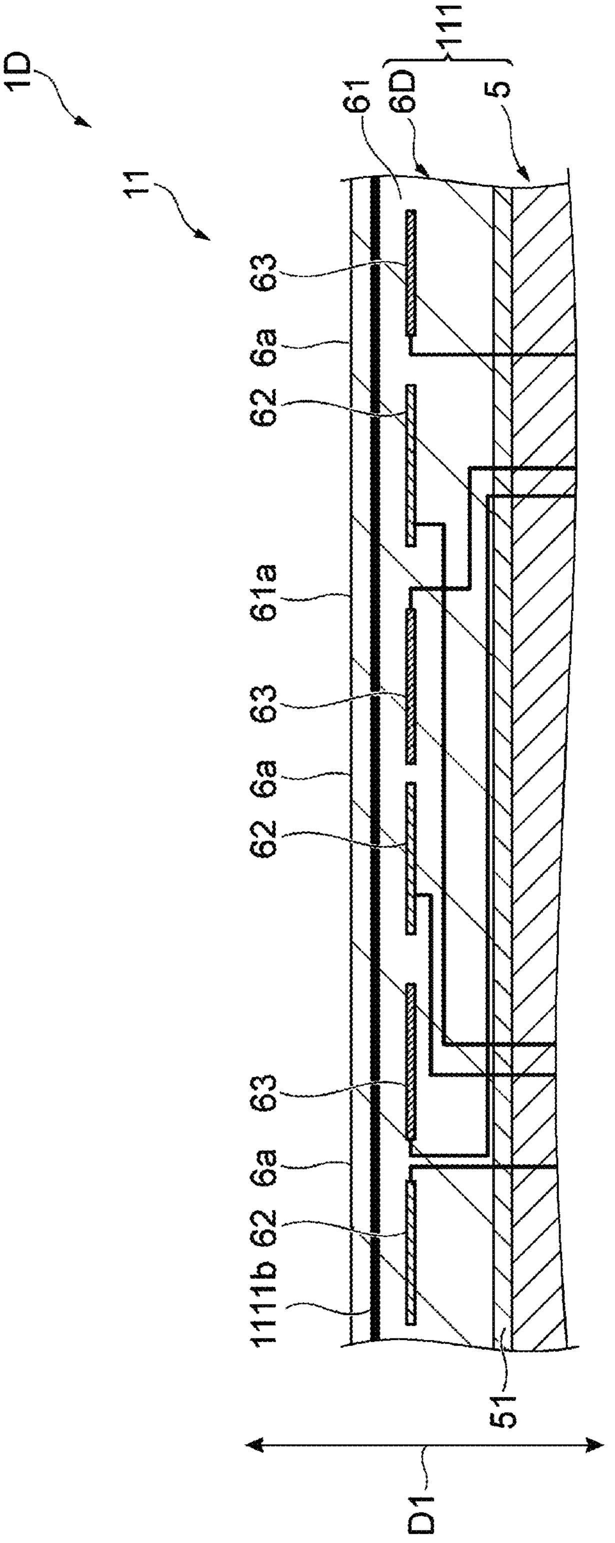
FIG. 10 is a partially-enlarged cross-sectional view of an electrostatic chuck according to yet another exemplary embodiment.

Next, a configuration of an electrostatic chuck of a plasma processing apparatus according to yet another embodiment will be described with reference to FIG. 10. FIG. 10 is a partially-enlarged cross-sectional view of the electrostatic chuck according to yet another exemplary embodiment. Hereinafter, the electrostatic chuck 6D of the plasma processing apparatus 1D shown in FIG. 10 will be described with a focus on differences from the electrostatic chuck 6 of the plasma processing apparatus 1.

The positions of the plurality of heater electrode layers 62 in the thickness direction D1 in the electrostatic chuck 6D are the same as the positions of the resistive layers 63 in the thickness direction D1. In one example, a distance between the support surface 61*a* and the plurality of heater electrode layers 62 in the thickness direction D1 and a distance between the support surface 61*a* and the plurality of resistive layers 63 in the thickness direction D1 are the same. In the plasma processing apparatus 1D, the plurality of heater electrode layers 62 and the plurality of resistive layers 63 are arranged at the same positions in the thickness direction D1 in the electrostatic chuck 6D.

Figure 11:
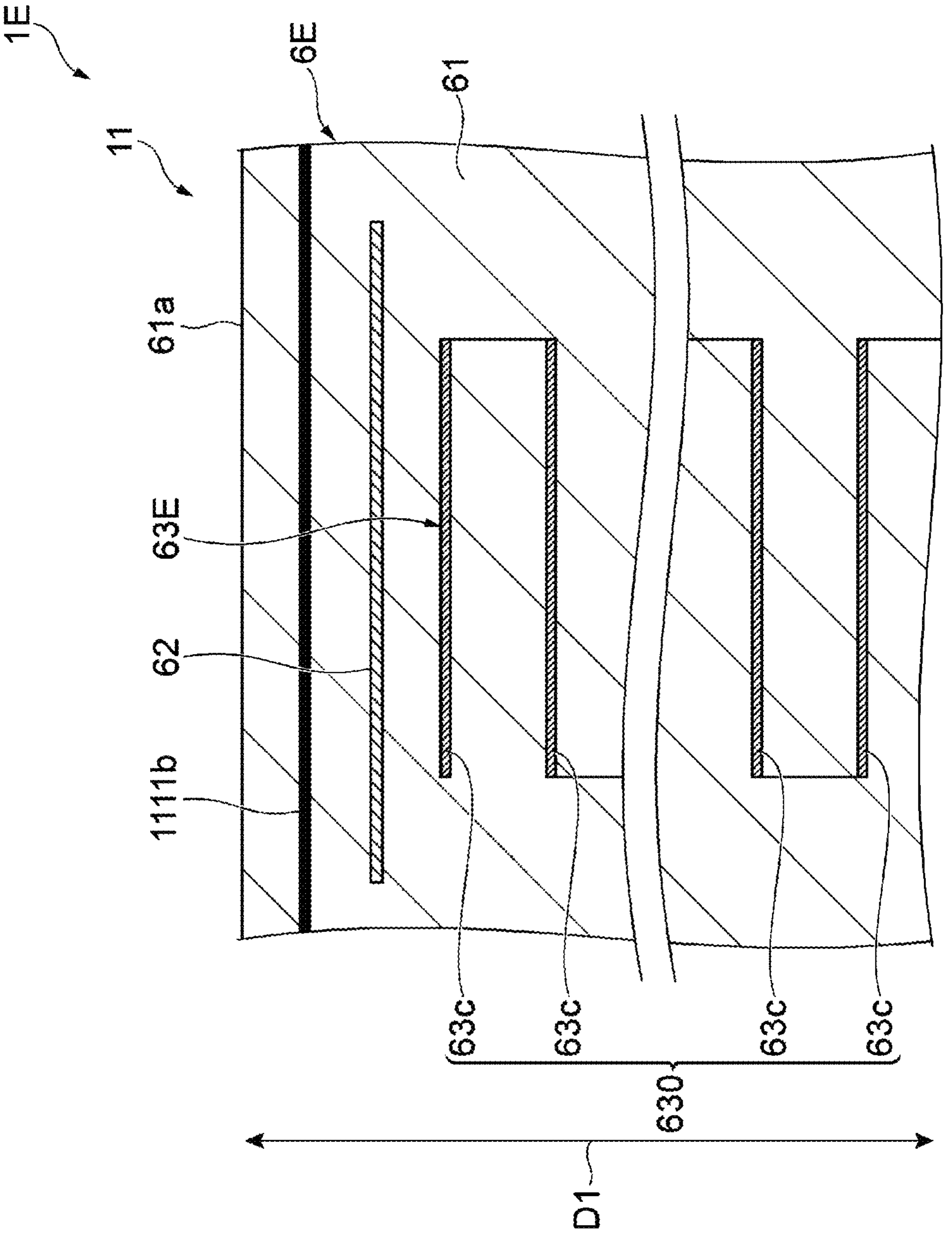
FIG. 11 is a partially-enlarged cross-sectional view of an electrostatic chuck according to yet another exemplary embodiment.

Next, a configuration of an electrostatic chuck of a plasma processing apparatus according to yet another exemplary embodiment will be described below with reference to FIG. 11. FIG. 11 is a partially-enlarged cross-sectional view of the electrostatic chuck according to yet another exemplary embodiment. Hereinafter, the electrostatic chuck 6E of the plasma processing apparatus 1E shown in FIG. 11 will be described with a focus on differences from the electrostatic chuck 6 of the plasma processing apparatus 1.

An electrostatic chuck 6E includes a plurality of resistive layers 63E. The plurality of resistive layers 63E include a plurality of layers 63*c*, respectively. In one example, the resistive layer 630 may include a plurality of layers 63*c*. Each of the plurality of layers 63*c* is a resistive layer. The plurality of layers 63*c* are stacked one above another between the support surface 61*a* and the base 5 in the electrostatic chuck 6E. In one example, the plurality of layers 63*c* are stacked one above another between the base 5 and the plurality of heater electrode layers 62. The plurality of layers 63*c* may be stacked one above another between the support surface 61*a* and the plurality of heater electrode layers 62. The plurality of layers 63*c* are connected in series to each other. Adjacent layers among the plurality of layers 63*c* may be connected in series to each other by via-holes.

Various exemplary embodiments have been described above, but various additions, omissions, substitutions, and modifications may be made without being limited to the above-described exemplary embodiments. In addition, elements in different embodiments may be combined to form other embodiments.

In other embodiments, the control circuit 7 and the detection circuit 8 may be arranged outside the internal space 5*s*.

Figure 12:
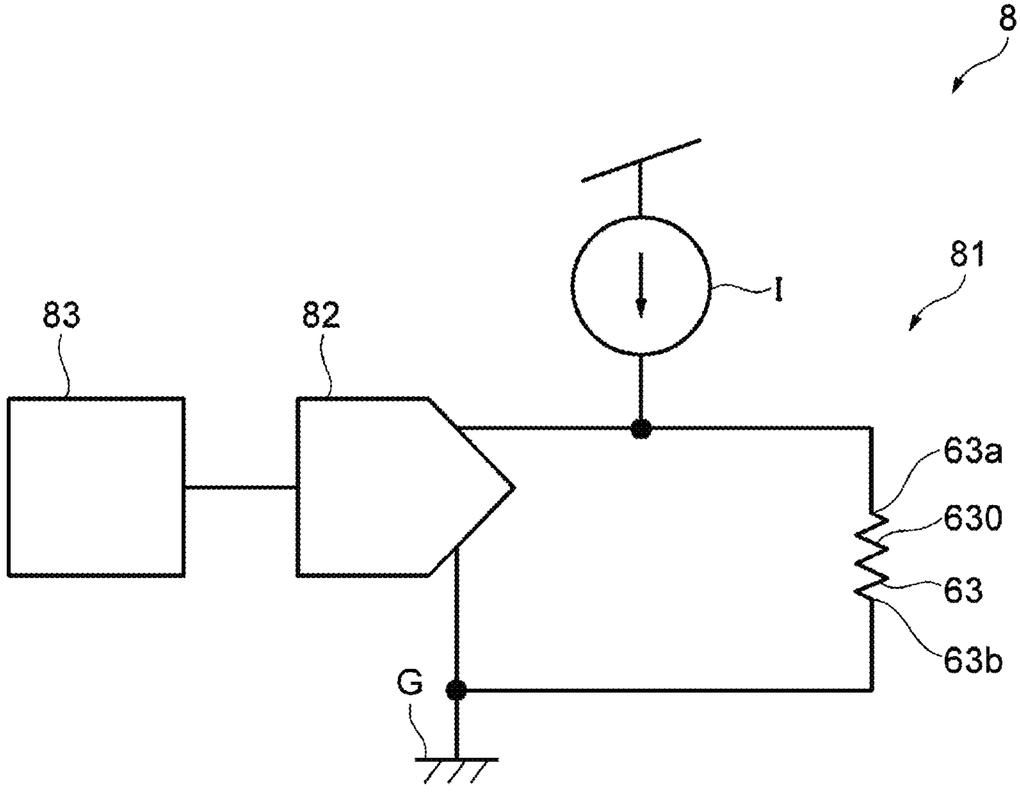
FIG. 12 is a view showing a configuration of a detection circuit according to another exemplary embodiment.

FIG. 12 is a view showing a configuration of a detection circuit according to another exemplary embodiment. As shown in FIG. 12, the detection circuit 8 may include a constant-current source I instead of the reference resistor R. The constant-current source I is connected to the resistive layer 630. The A/D converter 82 converts a voltage applied to the resistive layer 630 into a digital value. In one example, the constant-current source I is connected to one end (for example, the first end 63*a*) of the resistive layer 630. In one embodiment, the A/D converter 82 is connected to one end (the first end 63*a*) connected to the constant-current source I. In this case, the value of the voltage applied to the resistive layer 630 changes so that a current applied to the resistive layer 630 is constant in response to a change in the resistance value of the resistive layer 630.

In the embodiment of FIG. 6, two or more of the plurality of resistive layers 63 may be arranged in at least one of the zones 6*a*. The temperature of two or more portions in which the two or more resistive layers are arranged in the at least one zone is specified. Each of the two or more resistive layers may include a plurality of layers 63*c*.

In the embodiment of FIG. 6, at least one of the plurality of resistive layers 63 may be arranged across two or more of the plurality of zones 6*a*. The two or more zones may be adjacent to each other. The temperature of two or more of the plurality of zones 6*a* is specified by at least one of the plurality of resistive layers 63.

A modification of the embodiment of FIG. 8 will be described. The plurality of radio-frequency electrode layers 64 may be applied to the electrostatic chuck 6 in which the plurality of heater electrode layers 62 shown in FIG. 3 extend between the plurality of resistive layers 63 and the support surface 61*a*. The plurality of radio-frequency electrode layers 64 may be applied to the electrostatic chuck 6C including the first resistive layer 631 and the second resistive layer 632 shown in FIG. 9. The plurality of radio-frequency electrode layers 64 may be applied to the electrostatic chuck 6D in which the positions of the plurality of heater electrode layers 62 in the thickness direction D1 in the electrostatic chuck 6D shown in FIG. 10 are the same as the positions of the plurality of resistive layers 63 in the thickness direction D1.

In a modification of the embodiment of FIG. 9, the plurality of heater electrode layers 62 may extend between the plurality of resistive layers 63C and the support surface 61*a*.

Here, various exemplary embodiments included in the present disclosure are described in [E1] to [E19] below.

E1

A substrate processing apparatus includes: a chamber having a processing space provided therein; a base arranged inside the processing space and having an internal space provided therein; an electrostatic chuck arranged on the base and including a dielectric member having a support surface with a substrate support surface, at least one heater electrode layer arranged inside the dielectric member and formed of a first material, and at least one resistive layer arranged inside the dielectric member and formed of a second material, the at least one resistive layer having a thickness of 300 μm or less, wherein a resistance temperature coefficient of the second material is equal to or greater than a resistance temperature coefficient of the first material; a control circuit arranged inside the internal space and configured to control power to be applied to the at least one heater electrode layer; and a detection circuit arranged inside the internal space and configured to detect a voltage applied to the at least one resistive layer.

E2

In the substrate processing apparatus of [E1] above, the resistance temperature coefficient of the second material is greater than the resistance temperature coefficient of the first material.

E3

In the substrate processing apparatus of [E1] or [E2] above, the second material is tungsten.

E4

In the substrate processing apparatus of any one of [E1] to [E3] above, the thickness of the at least one resistive layer is 100 μm or less.

E5

In the substrate processing apparatus of any one of [E1] to [E4] above, a position of the at least one heater electrode layer in a thickness direction inside the electrostatic chuck is different from a position of the at least one resistive layer in the thickness direction.

E6

In the substrate processing apparatus of [E5] above, the at least one heater electrode layer extends between the at least one resistive layer and the support surface.

E7

In the substrate processing apparatus of [E5] above, the at least one resistive layer extends between the at least one heater electrode layer and the support surface.

E8

In the substrate processing apparatus of any one of [E1] to [E7] above, the at least one resistive layer includes a first resistive layer and a second resistive layer, the second resistive layer extends between the first resistive layer and the support surface, and the detection circuit is configured to detect a first voltage applied to the first resistive layer and a second voltage applied to the second resistive layer. The substrate processing apparatus further includes: a controller configured to specify a first temperature of the first resistive layer and a second temperature of the second resistive layer based on the first voltage and the second voltage, respectively, and configured to specify a thermal flux from the support surface based on the first temperature, the second temperature, a thermal conductivity of the dielectric member, and a distance between the first resistive layer and the second resistive layer in the thickness direction.

E9

In the substrate processing apparatus of any one of [E1] to [E4] and [E8] above, a position of the at least one heater electrode layer in a thickness direction inside the electrostatic chuck is same as a position of the at least one resistive layer in the thickness direction.

E10

In the substrate processing apparatus of any one of [E1] to [E9] above, the support surface includes a plurality of regions, the electrostatic chuck has a plurality of zones respectively having the plurality of regions, the at least one heater electrode layer includes a plurality of heater electrode layers, the plurality of heater electrode layers are arranged inside the plurality of zones, respectively, the at least one resistive layer includes a plurality of resistive layers, the plurality of resistive layers include at least one additional resistive layer arranged inside the plurality of zones, the control circuit is configured to control each of a plurality of powers to be applied to the plurality of heater electrode layers, and the detection circuit is configured to detect each of a plurality of values of voltages applied to the plurality of resistive layers.

E11

In the substrate processing apparatus of any one of [E1] to [E9] above, the support surface includes a plurality of regions, the electrostatic chuck has a plurality of zones respectively having the plurality of regions, the at least one heater electrode layer includes a plurality of heater electrode layers, the plurality of heater electrode layers are arranged inside the plurality of zones, respectively, the at least one resistive layer includes a plurality of resistive layers, the plurality of resistive layers include a resistive layer arranged across two or more corresponding zones among the plurality of zones, the control circuit is configured to control each of a plurality of powers to be applied to the plurality of heater electrode layers, and the detection circuit is configured to detect each of a plurality of values of voltages applied to the plurality of resistive layers.

E12

In the substrate processing apparatus of any one of [E1] to [E11] above, the at least one resistive layer includes a plurality of layers, and the plurality of layers are stacked one above another in a series connection manner between the support surface and the base inside the electrostatic chuck.

E13

In the substrate processing apparatus of any one of [E1] to [E12] above, the electrostatic chuck further includes at least one radio-frequency electrode layer, and the at least one radio-frequency electrode layer is electrically connected to the base and is configured to surround the at least one heater electrode layer and the at least one resistive layer inside the electrostatic chuck.

E14

In the substrate processing apparatus of [E13] above further includes a radio-frequency power supply electrically connected to the base.

E15

In the substrate processing apparatus of [E13] above, the electrostatic chuck further includes an electrostatic electrode, and the electrostatic electrode extends between the support surface and the at least one radio-frequency electrode layer.

E16

In the substrate processing apparatus of any one of [E1] to [E15] above, the detection circuit includes: a resistive voltage-dividing circuit including the at least one resistive layer and a reference resistor connected in series to the at least one resistive layer; and an A/D converter configured to convert a voltage applied to the at least one resistive layer into a digital value.

E17

In the substrate processing apparatus of [E16] above, the A/D converter is connected to one end of the at least one resistive layer, and the one end of the at least one resistive layer is connected to the reference resistor.

E18

In the substrate processing apparatus of any one of [E1] to [E15] above, the detection circuit includes: a constant-current source connected to the at least one resistive layer; and an A/D converter configured to convert a voltage applied to the at least one resistive layer into a digital value.

E19

In the substrate processing apparatus of [E18] above, the A/D converter is connected to one end of the at least one resistive layer connected to the constant-current source.

According to the present disclosure in some exemplary embodiments, a technique for specifying a temperature of an electrostatic chuck is provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:

a chamber having a processing space provided therein;

a base arranged inside the processing space and having an internal space provided therein;

an electrostatic chuck arranged on the base and including:

a dielectric member having a support surface with a substrate support surface;

at least one heater electrode layer arranged inside the dielectric member and formed of a first material; and at least one resistive layer arranged inside the dielectric member and formed of a second material, the at least one resistive layer including a first resistive layer and a second resistive layer, wherein the second resistive layer extends between the first resistive layer and the support surface, the at least one resistive layer having a thickness of 300 μm or less, wherein a resistance temperature coefficient of the second material is equal to or greater than a resistance temperature coefficient of the first material;

a control circuit arranged inside the internal space and configured to control power to be applied to the at least one heater electrode layer; and a detection circuit arranged inside the internal space and configured to detect a first voltage applied to the first resistive layer, detect a second voltage applied to the second resistive layer, specify a first temperature of the first resistive layer and a second temperature of the second resistive layer based on the first voltage and the second voltage, respectively, and specify a thermal flux from the support surface based on the first temperature, the second temperature, a thermal conductivity of the dielectric member, and a distance between the first resistive layer and the second resistive layer in a thickness direction.

2. The substrate processing apparatus of claim 1, wherein the resistance temperature coefficient of the second material is greater than the resistance temperature coefficient of the first material.

3. The substrate processing apparatus of claim 1, wherein the second material is tungsten.

4. The substrate processing apparatus of claim 1, wherein the thickness of the at least one resistive layer is 100 μm or less.

5. The substrate processing apparatus of claim 1, wherein a position of the at least one heater electrode layer in a thickness direction inside the electrostatic chuck is different from a position of the at least one resistive layer in the thickness direction.

6. The substrate processing apparatus of claim 5, wherein the at least one heater electrode layer extends between the at least one resistive layer and the support surface.

7. The substrate processing apparatus of claim 5, wherein the at least one resistive layer extends between the at least one heater electrode layer and the support surface.

8. The substrate processing apparatus of claim 1, wherein a position of the at least one heater electrode layer in a thickness direction inside the electrostatic chuck is same as a position of the at least one resistive layer in the thickness direction.

9. The substrate processing apparatus of claim 1, wherein the support surface includes a plurality of regions, wherein the electrostatic chuck has a plurality of zones respectively having the plurality of regions, wherein the at least one heater electrode layer includes a plurality of heater electrode layers, wherein the plurality of heater electrode layers are arranged inside the plurality of zones, respectively, wherein the at least one resistive layer includes a plurality of resistive layers, wherein the plurality of resistive layers include at least one additional resistive layer arranged inside the plurality of zones, wherein the control circuit is configured to control each of a plurality of powers to be applied to the plurality of heater electrode layers, and wherein the detection circuit is configured to detect each of a plurality of values of voltages applied to the plurality of resistive layers.

10. The substrate processing apparatus of claim 1, wherein the support surface includes a plurality of regions, wherein the electrostatic chuck has a plurality of zones respectively having the plurality of regions, wherein the at least one heater electrode layer includes a plurality of heater electrode layers, wherein the plurality of heater electrode layers are arranged inside the plurality of zones, respectively, wherein the at least one resistive layer includes a plurality of resistive layers, wherein the plurality of resistive layers include a resistive layer arranged across two or more corresponding zones among the plurality of zones, wherein the control circuit is configured to control each of a plurality of powers to be applied to the plurality of heater electrode layers, and wherein the detection circuit is configured to detect each of a plurality of values of voltages applied to the plurality of resistive layers.

11. The substrate processing apparatus of claim 1, wherein the at least one resistive layer includes a plurality of layers, and wherein the plurality of layers are stacked one above another in a series connection manner between the support surface and the base inside the electrostatic chuck.

12. The substrate processing apparatus of claim 1, wherein the electrostatic chuck further includes at least one radio-frequency electrode layer, and wherein the at least one radio-frequency electrode layer is electrically connected to the base and is configured to surround the at least one heater electrode layer and the at least one resistive layer inside the electrostatic chuck.

13. The substrate processing apparatus of claim 12, further comprising: a radio-frequency power supply electrically connected to the base.

14. The substrate processing apparatus of claim 12, wherein the electrostatic chuck further includes an electrostatic electrode, and wherein the electrostatic electrode extends between the support surface and the at least one radio-frequency electrode layer.

15. The substrate processing apparatus of claim 1, wherein the detection circuit includes:

a resistive voltage-dividing circuit including the at least one resistive layer and a reference resistor connected in series to the at least one resistive layer; and an A/D converter configured to convert a voltage applied to the at least one resistive layer into a digital value.

* * * * *